United States Patent [19]

Drews et al.

[11] Patent Number: 4,531,190

[45] Date of Patent: Jul. 23, 1985

[54] ELECTRONIC ENGINE CONTROL SYSTEM WITH EMERGENCY OPERATION MODE

[75] Inventors: Ulrich Drews, Vaihingen/Enz; Manfred Mezger, Markgröningen; Bernhard Schmidt, Leonberg; Karl Seeger, Markgröningen; Gerhard Söhner, Remshalden; Herman Roozenbeek, Schwieberdingen, all of Fed. Rep. of Germany

[73] Assignee: Robert Bosch GmbH, Stuttgart, Fed. Rep. of Germany

[21] Appl. No.: 345,225

[22] Filed: Feb. 3, 1982

[30] Foreign Application Priority Data

May 22, 1981 [DE] Fed. Rep. of Germany ....... 3120360

Jan. 11, 1982 [DE] Fed. Rep. of Germany ....... 3200856

[51] Int. Cl.[3] .......................... F02P 11/06; F02P 5/02; G01R 19/165

[52] U.S. Cl. ............................... 364/431.11; 123/479; 371/66

[58] Field of Search ...................... 364/431.06, 431.11, 364/431.1; 123/479, 415, 416, 417, 418, 424; 371/11, 12, 66

[56] References Cited

U.S. PATENT DOCUMENTS 4,099,495 7/1978 Kiencke et al. ..................... 364/442
4,174,688 11/1979 Hönig et al. ......................... 123/416
4,201,163 5/1980 Hattori et al. ....................... 123/418
4,210,111 7/1980 Hattori et al. .................. 123/416 X
4,236,214 11/1980 Sasayama ............................ 123/417
4,244,050 1/1981 Weber et al. .......................... 371/66
4,245,315 1/1981 Barman et al. ................. 364/431.11
4,255,789 3/1981 Hartford et al. ............... 364/431.06
4,287,565 9/1981 Haubner et al. ................ 123/479 X
4,370,962 2/1983 Hosaka ........................... 123/479 X
4,386,427 5/1983 Hosaka .................................. 371/11
4,414,949 11/1983 Hönig et al. ......................... 123/479

*Primary Examiner*—Felix D. Gruber
*Attorney, Agent, or Firm*—Frishauf, Holtz, Goodman & Woodward

[57] ABSTRACT

To permit continued operation of a vehicle in spite of malfunction of an electronic ignition computer system, or any other electronic control module in an automotive vehicle, a transducer (10) provides an output to a trigger stage which has its output connected a digitally operating microprocessor (17) and to a bypass or transfer switch (21). The output from the microprocessor is connected to an analog and operating output stage (19, 20) to be controlled by the digital system of the microprocessor (17). Upon sensing of low operating voltage (U) as determined, for example, by a threshold switch (22), or of starting condition the switch (21) is closed, bypassing or interrupting connection to the microprocessor, and directly connecting signals from the transducer output stage to the input of the ignition circuit to permit operation under emergency conditions. The analog portion of the system is a single integrated module, separate from the digitally operating microprocessor (17) for ease of error diagnosis, maintenance and repair. This is particularly important with digitally operating control systems (17) which are subject to malfunction under low voltage conditions or upon occurrence of stray or distrubance signals in the network, for example under starting conditions.

16 Claims, 2 Drawing Figures

ELECTRONIC ENGINE CONTROL SYSTEM WITH EMERGENCY OPERATION MODE

REFERENCE TO RELATED PUBLICATIONS

Figure 1:
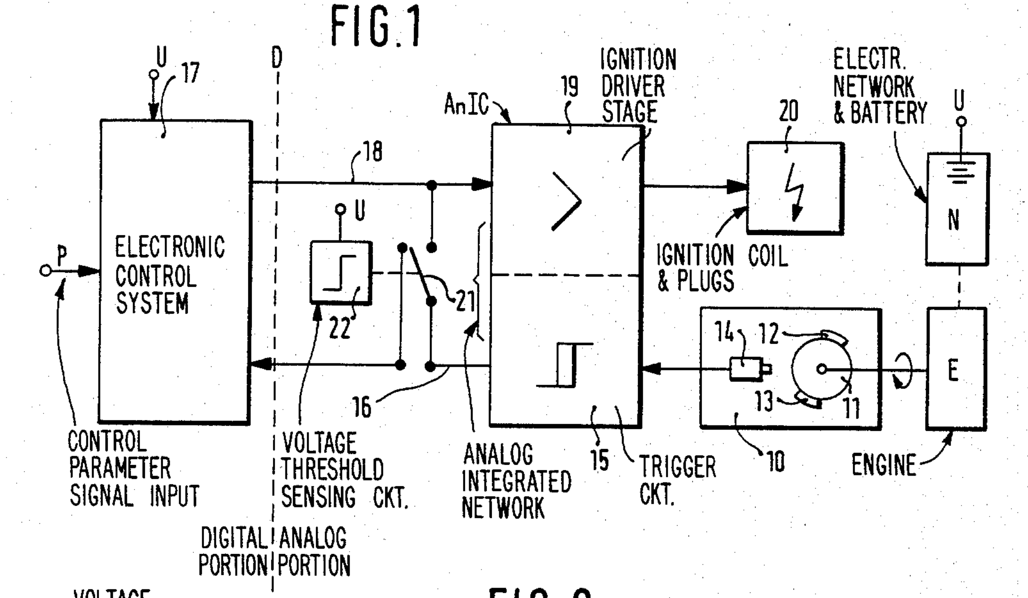

DE-OS No. 26 55 948 corresponding to U.S. Pat. No. 4,174,688, HONIG et al;

DE-OS No. 29 03 638 corresponding to U.S. Pat. No. 4,287,565, HAUBNER et al, both assigned to the assignee of this application.

The present invention relates to electronic control systems for automotive vehicles, and more particularly to control systems which include a switching arrangement which permits operation of the vehicle under emergency conditions in case of failure or malfunction of the electronic control system, or parts or components thereof.

BACKGROUND

Electronic control systems, so-called "on-board computers", are frequently used in automative vehicles; one such computer is described in German Patent Disclosure Document DE-OS No. 26 55 948 to which U.S. Pat. No. 4,174,688 corresponds, directed to a computer to calculate the proper timing of the ignition instant of an external ignition system, and the control of current flow through one or more ignition coils. Many types of motor vehicles use, also, other electronic apparatus which control various features of the power drive train, for example which are arranged to sense engine knocking, control injection of fuel, and the like, and derive electrical signals which are fed to the on-board vehicular computer. The vehicular computer customarily cooperates with a transducer, for example an optical, magnetic, or similar transducer, which has a part rotating in synchronism with the engine, and is electrically connected to a trigger circuit to which, in turn, a digital network is connected, which forms part or all of the computer, to calculate the time of initiation of current flow through an ignition coil and the time of interruption of current flow, and hence the ignition instant. The signal processing is analog/digital/analog, that is, the transducer and trigger circuit provide analog signals respectively representative of the rotation of the engine, and the output circuit likewise is an analog circuit which controls the current flow through the ignition coil. Intermediate calculating steps are carried out by a digitally operating microprocessor. Such systems, particularly when applied to ignition systems which calculate the dwell angle in a digital microprocessor are sensitive to operating voltage, that is, to voltage below a predetermined minimum operating level. If the voltage of the network drops below the minimum level, some or all of the networks of the digital microprocessor no longer operate as designed and intended, which may result in erroneous signals being applied to the analog output stages, and hence storage of electromagnetic energy under erroneous condition and triggering of sparks at uncontrolled random time instants.

THE INVENTION

It is an object to combine the reliability of a directly controlled operating system with the advantage of the accurate control possibilities afforded by microprocessors, and to permit operation of the vehicle under conditions of low battery voltage or under malfunction conditions of the microprocessor system to thereby prevent complete breakdown of the drive train of the vehicle.

Briefly, a battery voltage sensing element is provided which, for example, may be in form of a Zener diode connected to a trigger or threshold circuit, a comparator, or the like, the sensing circuit providing a battery voltage level signal. The sensing signal is applied to a switch which connects, directly, the trigger signals delivered from the transducer, for example breaker terminals of an ignition distributor, or optical or magnetic transducer signals, wave-shaped by a trigger circuit, to the engine operation control system, for example the ignition system thereof, the switch being operated if the battery voltage level signal indicates that the battery voltage is below a predetermined level. In this low-level battery voltage mode, the switch bypasses the signal processing stage of the microprocessor.

In accordance with a feature of the invention, the switch control can be additionally rendered effective by providing a sensing or monitoring stage which monitors operating conditions of the engine; one such operating condition is, for example, if the starter switch is operated, the switch then responding by bypassing the microprocessor control system if the starter switch is in "start" condition. This prevents interference of microprocessor operation by stray disturbance signals from the starter. The monitoring circuit can, additionally, be connected to the microprocessor to sense malfunction thereof and, in case such malfunction is sensed, effect bypassing thereof and direct connection of the ignition transducer output to the ignition stage.

The system has the advantage that bridging the microprocessor, that is, effectively replacing the microprocessor ignition timing, or injection timing, or otherwise signal processing circuit, malfunction due to low battery voltage or stray noise signals which are known to occur can be prevented. The problem of low battery voltage also arises during starting. Control of the final output stage then is effected directly with the signal from the transducer, if necessary over a simple auxiliary circuit which can be constructed to be operative at low battery voltages, since this is the only time it will be rendered effective. The control of ignition timing, or other control functions, will no longer be in dependence on the operating parameters of the engine, for example loading or the like; while the ignition timing may no longer be an optimum, the operating time under starting will be very short and, under otherwise emergency conditions, the engine will still remain operative. Temporary emergency operation under less than optimum conditions is to be preferred, in any event, to total breakdown of the drive train system.

The arrangement, in accordance with a preferred feature of the invention, is so made that the electronic switching system is bridged. This permits constructing the electronics in two discrete network modules, in which one network module comprises the control or microprocessor portion and the other the analog transducer-output stage portion. By placing all the electronic control functions into a single module, which may include one or more integrated circuits, replacement or repair of components or the entire module is simple, and response of the bridging circuit, if a malfunction monitor is included, will provide a diagnostic indication to repair personnel for corrective steps to be taken.

DRAWINGS

Figure 2:
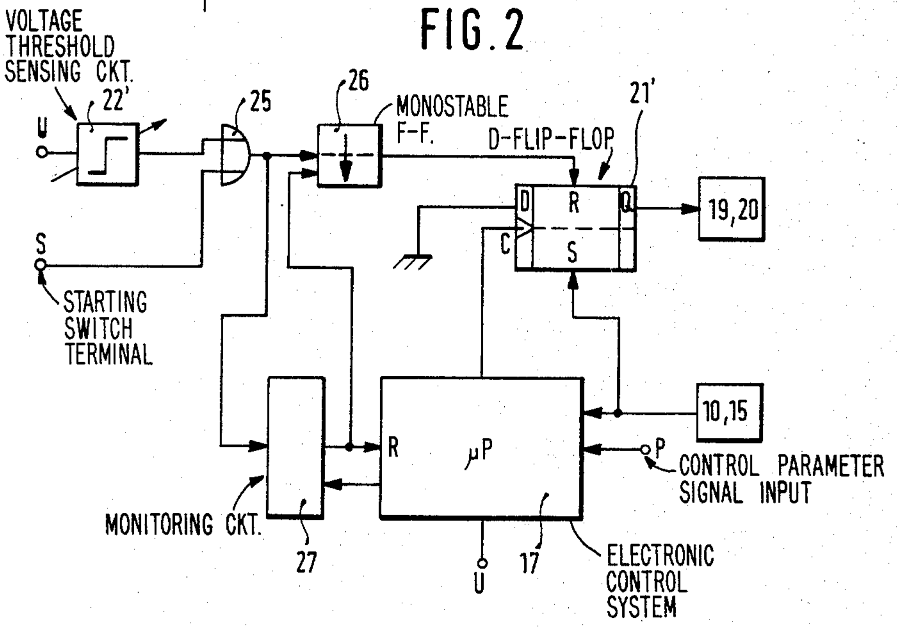

FIG. 1 is a schematic diagram of the system in accordance with the invention in its simplest form; and FIG. 2 illustrates another system utilizing a microprocessor control network.

A transducer 10—see FIG. 1—is constructed, preferably, by employing a rotating disk 11 which may be formed of sheet metal and has two angular segments 12, 13 thereon. Disk 11 is coupled to rotate in synchronism with rotation of the engine E. The engine E is connected to an electrical network and a battery, N, which provides an output voltage U. The network N, in a vehicle, includes an alternator, driven by the engine as schematically shown by the dotted connection, a rectifier network and associated controls, and a battery which is being charged upon rotation of the engine by current from the alternator.

The transducer 10, with the disk 11, has an electrical output pick-up 14 which scans the angular segments 12, 13. The number of the angular segments depends on the number of cylinders of the internal combustion (IC) engine E. The pick-up 14 may operate on optical principle, inductive principle, or may utilize a Hall generator, or any other suitable device; it may, also, be formed by a mechanical breaker system, as well known.

Transducer 14 is coupled over a trigger circuit 15 which, for example, is a Schmitt trigger, to a connecting bus 16. Connecting bus 16 connects the output of trigger circuit 15 to an electronic ignition control system 17. The electronic ignition control system 17 receives operating voltage U and input signals which depend on various parameters P. The parameters, in accordance with well known technology, may include temperature, pressure in the induction pipe, exhaust gas data, and the like. Depending on the input, and on the timing and occurrence of the trigger signals from trigger circuit 15, electronic control system 17 provides outputs which define the dwell angle, that is, the relative time of closing of a switch in series with an ignition coil and opening of the switch triggering an ignition spark. The circuit of electronic system 17 preferably operates digitally. The output of the control system 17 is connected over a cable, shown as a single line 18, with a final ignition output control unit 19 which, as customary, includes a driver stage and a final output transistor connected thereto and controlled thereby. The components 15, 19 preferably are included in a single common analog integrated network AnIC, and thus are shown within a single solid line block, merely subdivided by a broken line to associate the respective functions of the modules 15 and 19. The system thus is divided into a digitally operating portion, and an analog portion, as schematically shown by division line D in FIG. 1.

The output of the output driver transistor in stage 19 is connected to an ignition unit 20 which, customarily, includes one or more ignition coils and spark plugs, possibly with the interposition of a spark plug distributor, in accordance with engine and engine ignition circuit design. In many installations, a distributor, rotating in synchronism with the engine E, may be used.

In accordance with the invention, the connecting buses 16, 18, leading from the trigger 15 to the electronic control system 17, and from the control system 17 to the ignition driver stage 19, are interconnected by a switch 21 which, thereby, bridges the electronic ignition control system 17. The switch 21 is controlled to operate in accordance with a voltage threshold signal derived from a threshold stage 22 which, in turn, is connected to receive the output U of the electrical network.

Operation: If the voltage U drops below a predetermined level which is at, or only just above the level at which the electronic ignition control system 17 may function erroneously, switch 21 is controlled to close. The switch 21 can be a single transfer switch which, in a first switching position, connects the output of the trigger circuit 15 with the input of the circuit 17 and, in the second switching position, the output of the trigger circuit 15 with the connection 18, rather than a shorting switch, as shown.

If the output voltage U is at a proper level, switch 21 will be open. Control signals for the ignition stage 20 will be computed by the electronic ignition control system 17 in dependence on the parameters P. If the output voltage U should drop unduly, so that the various electronic components or elements within the control system 17 may no longer operate as designed, and in accordance with their proper logic, switch 21 will close and control signals for the ignition driver stage and ignition output stage 20 will be switched directly from the transducer 10 and trigger circuit 15. The ignition setting, that is, the ignition timing, may no longer be the optimum for the then pertaining engine or vehicle operating conditions; the ignition timing will be sufficient, however, to operate for the period of time that the voltage is below the required level and until the proper operating level is reestablished. The system is based on the realization that the electronic control system 17, to calculate the appropriate closing and opening instants of the ignition system, includes elements and components which are much more susceptible to malfunction under low-voltage conditions that the usually rugged and essentially voltage independent system of the trigger circuit 15 and the ignition driver stage 19 and output stage 20. Digital systems used in the electronic ignition control system 17 are particularly susceptible to voltages below design value.

The embodiment of FIG. 2, basically, operates similarly to that of FIG. 1. To determine the dwell angle and/or the ignition timing angle, electronic control system 17 is constructed in form of a digitally operating microprocessor. As in the embodiment of FIG. 1, a transducer 10 and a trigger stage 15 are provided, shown only as a single block. The trigger stage 15 provides, itself, already control signals which are applied to the microprocessor 17 and, additionally, through a switch shown as a D-flip-flop 21', to the ignition output, collectively formed by the driver stage 19 and the ignition stage 20. Change-over between control by microprocessor 17 or direct control from the transducer/trigger circuit 10/15 is effected by the D-flip-flop 21', which corresponds to the switch 21 of FIG. 1. The output of the trigger circuit 15 is connected to the SET input S, the output of the microprocessor 17 is connected to the clock input C, and the D input of the flip-flop 21' is connected to ground or chassis. Transfer signals are applied to the RESET input R. The direct output Q is connected to the ignition output stage combination 19/20.

The ignition output stage 19 and/or the trigger circuit 15 may be used, of course, to additionally control other operating functions, such as providing speed-dependent signals and the like.

A voltage threshold sensing stage 22', in the form of a threshold circuit, is connected to control the D-flip-flop (FF) 21′ via an OR-gate 25 and a timing stage 26 which, in its simplest form, is constructed as a monostable FF which can be retriggered. The OR-gate 25 has a starting signal from a starter terminal S applied thereto, for example a signal derived from the starter relay. The microprocessor 17 is connected to a monitoring circuit 27. Monitoring circuit 27 monitors proper run of programs in the microprocessor 17. Monitoring circuits of such type are known—see, for example, German Patent Disclosure Document DE-OS No. 29 03 638 now U.S. Pat. No. 4,287,565. Such monitoring systems provide a reset signal R for the microprocessor if various malfunction conditions or errors are recognized. The reset signal applied by the monitoring circuit 27 to the microprocessor 17 is additionally connected with a further trigger input of the timing circuit 26. The output of the OR-gate 25 is likewise connected as an input to the monitoring circuit 27.

Operation of system of FIG. 2: Basically, the operation is similar to that described in connection with FIG. 1. A transfer signal to switch 21, formed by the FF 21′, is applied under various conditions, however, and not only if the minimum voltage is passed, thereby triggering the threshold stage 22′. The FF 21′ is also triggered during starting of the IC engine, and under microprocessor 17 malfunction conditions. It is well known that, under starting conditions, the supply voltage drops substantially. Thus, the threshold stage 22 could be arranged to sense such low voltages. If, however, the battery of the electrical network should be very powerful and fully charged, the voltage may not drop below the trigger threshold of stage 22′. Under starting conditions, interference signals are generated which have particularly disturbing effects on the operation of a microprocessor. Additionally, direct triggering of the ignition system should be effected upon malfunction of the microprocessor. Thus, in accordance with the embodiment of FIG. 2, direct switching of the signals from the transducer 10 and trigger circuit 15 to the ignition output 19/20 is obtained under the condition (a) low voltage at terminal U; or
(b) starting condition, terminal s activated; or
(c) malfunction or errors in the program being run in microprocessor 17, as determined by monitoring circuit 27.

The timing circuit 26, which can be re-triggered, is a further addition over the circuit of FIG. 1. The timing circuit insures that, after a malfunction or error, or one of the conditions (a), (b), (c) above, have been eliminated, switch-over to the control by the microprocessor is not effected imediately, but only a short time thereafter. This permits reliable start-up of the microprocessor and run of at least a portion of the program thereof. Thus, for example, upon termination of starting, or upon reestablishment of proper output voltage U, the engine will continue to operate for a very short period of time directly and not under microprocessor control. During starting, or when low voltage conditions arise, the microprocessor is continuously RESET by an output from the monitoring circuit 27 under control of the signal derived from the OR-gate 25 and applied to the monitoring circuit as a further signal which should cause resetting of the microprocessor 17. Resetting of the microprocessor can, of course, also be effected directly from an output of the OR-gate to the reset terminal R of the microprocessor 17, for example with interposition of a suitable gate or buffer, as well known. Control from the monitoring circuit 27, however, is preferred since the output of the monitoring circuit 27 can be matched directly to the input of the microprocessor 17.

Switch 21 preferably is constructed in form of the D-FF 21′. Transition of the output signal from the output Q from a 1-signal to a 0-signal triggers an ignition event. In normal operation, FF 21′ is SET by an output from the transducer 10—trigger circuit 15 combination, and RESET by a signal to the clock input C derived from the microprocessor 17. A 1-signal at the reset input R, which is representative of low voltage or starting condition, or of malfunction or improper program run in the microprocessor 17, then provides for direct through-connection or through-switching of the signals from the transducer 10—trigger circuit 15 combination to the ignition stages 19/20, without delay, and without calculation of a precise ignition firing instant.

The control system has been described with respect to an ignition system applied to a vehicular IC engine. It is, of course, equally applicable for other systems, for example for systems used to control the quantity of fuel to be injected, airfuel mixture control, to control shifting of automatic transmissions, control systems used in connection with engine knock detection systems, and the like, in short, in connection with any component of the power drive train of a vehicle which, unless functioning properly, will result in breakdown of vehicle operation or highly erratic or improper operation thereof.

Various changes and modifications may be made, and features described in connection with any one of the embodiments may be used with any of the others, within the scope of the inventive concept.

We claim:

1. Electronic engine control system for an internal combustion engine (E) with emergency operation mode having means (N) providing an operating voltage (U) of varying low-voltage levels;

a transducer (10) coupled to the engine (E) and providing engine speed signals;

a trigger circuit (15) coupled to the transducers, receiving the engine speed signals and providing trigger signals;

a digitally operating signal processing stage (17) receiving (a) operating voltage (U) from said voltage providing means (N), and (b) the trigger signals, and providing digitally processed output control signals;

coupling circuit means (19) receiving said processed output control signals and providing engine operating signals;

engine operation elements (20) coupled to the engine operating signals for controlling operation of the engine (E), said trigger circuit and said coupling circuit means forming at least part of an analog portion of the system in which the signals occurring therein are processed in analog mode, and said digital signal processing stage forming a digital portion of the system in which the signals occurring therein are processed in digital mode;

voltage level sensing means (22) coupled to the operating voltage providing means (N) and providing operating voltage level signals representative of, respectively, operating voltage above or below a predetermined level, and thus indicating either "adequate voltage" or "low voltage" conditions;

and switch means (21, 21') controlled by said operating voltage level signals and connecting the trigger signals to the coupling circuit means (19) and bypassing said digitally operating signal processing stage (17) when said operating voltage sensing means senses an operating voltage below a predetermined level and provides a corresponding "low voltage condition" signal, said voltage level sensing means and said switch means forming part of said analog portion of the system.

2. System according to claim 1, wherein the internal combustion engine has means to control the ignition thereof, wherein the transistor (10) provides output signals depending on the angular position of a piston of the engine, and said signal processing stage (17) generates control signals determining the dwell angle and the ignition instant for the engine.

3. System according to claim 1, wherein said switch means (21, 21') is controlled by said operating voltage level signal to switch at a selectively predetermined voltage level.

4. System according to claim 1, wherein a starter switch terminal is provided to control starting of the engine, said starter switch terminal having a signal thereon representative of operation of the starter;

and said switching means (21) is additionally controlled to, selectively, switch upon recognition of the signal representative of starter operation.

5. System according to claim 1, wherein a starter switch terminal is provided to control starting of the engine;

and said switch means (21, 21') is additionally controlled to switch upon recognition of operation of a starter of the engine.

6. System according to claim 1, wherein the coupling circuit means includes an ignition driver stage;

wherein said trigger stage and driver stage are combined to form a first integrated network module operating in analog mode;

and wherein, further, said signal processing stage (17) forms a second integrated circuit module operating in the digital mode.

7. System according to claim 1, wherein said signal processing stage (17) comprises a microprocessor;

a monitoring circuit (27) is provided, connected to the microprocessor and monitoring proper program run, and operation thereof, the monitoring circuit (27) providing a reset signal for the microprocessor;

and wherein said operating voltage level signals are additionally connected to the microprocessor to retain the microprocessor in reset condition if said operating voltage signals indicate a "low voltage" condition.

8. System according to claim 7, wherein malfunction output signals from the monitoring circuit (27) are additionally connected to said switch means (21, 21') to operate said switch means to bypass the signal processing stage upon detection of malfunction or improper program run.

9. System according to claim 1, further including a timing circuit (26) connected ahead of said switch means (21) to delay release of said switch means and eliminate bypassing of the signal processing stage for a predetermined timing interval even after termination of the operating voltage level signal.

10. System according to claim 1, wherein said switch means comprises a D-flip flop (21'), the transducer (10) is connected to the SET input (S) thereof, the operating voltage signals are connected to the RESET input (R) thereof;

the output signals from the signal processing stage (17) are connected to the clock input (C) thereof; and the output signals from an output terminal (Q) of the flip flop (21') are connected to the coupling circuit means (19).

11. Electronic engine control system for an internal combustion engine (E) with emergency operation mode having means (N) providing an operating voltage (U) of varying low-voltage levels;

a transducer (10) coupled to the engine (E) and providing engine speed signals;

a trigger circuit (15) coupled to the transducers, receiving the engine speed signals and providing trigger signals;

a digitally operating signal processing stage (17) receiving (a) operating voltage (U) from said voltage providing means (N), and (b) the trigger signals, and providing digitally processed output control signals;

coupling circuit means (19) receiving said processed output control signals and providing engine operating signals;

engine operation elements (20) coupled to the engine operating signals for controlling operation of the engine (E), said trigger circuit and said coupling circuit means forming at least part of an analog portion of the system in which the signals occurring therein are processed in analog mode, and said digital signal processing stage forming a digital portion of the system in which the signals occurring therein are processed in digital mode;

a starter switch selectively connecting the operating voltage providing means (N) to a starter for starting of the engine;

and controlled switch means responsive to energization of the starter by said starter switch and then connecting the trigger signals to the coupling circuit means (19) and bypassing said digitally operating signal processing stage (17) to provide for response of the engine operation elements (20) to the trigger signals as delivered from the transducer (10) without processing in said digital signal processing stage (17) and solely processing the signals from the transducers in the analog portion of the system upon recognition of operation of the starter of the engine.

12. System according to claim 11, wherein the switch means (21, 21') is controlled from a starting switch terminal (S) of the starter switch.

13. System according to claim 11, wherein the switch means (21, 21') is controlled by a signal representative of starter operation.

14. System according to claim 11, wherein the internal combustion engine has means to control the ignition thereof, and wherein the transducer (10) provides output signals depending on the angular position of a piston of the engine, and said signal processing stage (17) generates control signals determining the dwell angle and the ignition instant for the engine.

15. System according to claim 11, wherein the coupling circuit means includes an ignition driver stage;

wherein said trigger stage and driver stage are combined to form a first integrated network module operating in analog mode;

and wherein, further, said signal processing stage (17) forms a second integrated circuit module operating in the digital mode.

16. System according to claim 11, wherein said switch means comprises a D-flip flop (21'), the transducer (10) is connected to the SET input (S) thereof, and a signal representative of energization of the starter is connected to the RESET input (R) thereof;

the output signals from the signal processing stage (17) are connected to the clock input (C) thereof; and the output signals from an output termnal (Q) of the flip flop (21') are connected to the signal coupling circuit means (19).

* * * * *